(12) United States Patent  
Firouzdor et al.

(10) Patent No.: US 11,773,479 B2
(45) Date of Patent: *Oct. 3, 2023

(54) PLASMA EROSION RESISTANT THIN FILM COATING FOR HIGH TEMPERATURE APPLICATION

(71) Applicant: Applied Materials, Inc., Santa Clara, CA (US)

(72) Inventors: Vahid Firouzdor, San Mateo, CA (US); Biraja P. Kanungo, San Jose, CA (US); Jennifer Y. Sun, Mountain View, CA (US); Martin J. Salinas, San Jose, CA (US); Jared Ahmad Lee, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 334 days.

This patent is subject to a terminal disclaimer.

(21) Appl. No.: 17/038,906

(22) Filed: Sep. 30, 2020

(65) Prior Publication Data

US 2021/0010126 A1    Jan. 14, 2021

Related U.S. Application Data

(63) Continuation of application No. 15/954,455, filed on Apr. 16, 2018, now Pat. No. 10,815,562, which is a (Continued)

(51) Int. Cl.
*C23C 14/08* (2006.01)
*C23C 14/02* (2006.01)
(Continued)

(52) U.S. Cl.
CPC ......... *C23C 14/081* (2013.01); *C23C 14/024* (2013.01); *C23C 14/0635* (2013.01);
(Continued)

(58) Field of Classification Search
CPC .................................................. C23C 14/081
See application file for complete search history.

(56) References Cited

U.S. PATENT DOCUMENTS 3,796,182 A    3/1974   Rosler
4,399,199 A    8/1983   McGill et al.
(Continued)

FOREIGN PATENT DOCUMENTS

JP    2001262346    9/2001
JP    2005097685    4/2005
(Continued)

OTHER PUBLICATIONS

Hass et al., "Gas jet assisted vapor deposition of yttria stabilized zirconia," Department of Materials Science and Engineering, School of Engineering and Applied Science, published Feb. 27, 2009 University of Virginia, Charlottesville, Virginia.
(Continued)

*Primary Examiner* — William P Watkins, III
(74) *Attorney, Agent, or Firm* — Lowenstein Sandler LLP

(57) ABSTRACT

An article such as a susceptor includes a body of a thermally conductive material coated by a first protective layer and a second protective layer over a surface of the body. The first protective layer is a thermally conductive ceramic. The second protective layer covers the first protective layer and is a plasma resistant ceramic thin film that is resistant to cracking at temperatures of 650 degrees Celsius.

15 Claims, 7 Drawing Sheets

Related U.S. Application Data continuation of application No. 14/693,745, filed on Apr. 22, 2015, now Pat. No. 9,976,211.

(60) Provisional application No. 61/984,691, filed on Apr. 25, 2014.

(51) Int. Cl.

| | | |
|---|---|---|
| *C23C 16/458* | (2006.01) | |
| *C23C 16/50* | (2006.01) | |
| *C23C 14/06* | (2006.01) | |
| *C23C 14/22* | (2006.01) | |

(52) U.S. Cl.
CPC ............ *C23C 14/08* (2013.01); *C23C 14/083* (2013.01); *C23C 14/221* (2013.01); *C23C 16/4581* (2013.01); *C23C 16/50* (2013.01)

(56) References Cited

U.S. PATENT DOCUMENTS

| | | | |
|---|---|---|---|
| 4,695,439 | A | 9/1987 | Ritsko et al. |
| 4,773,928 | A | 9/1988 | Houck et al. |
| 4,880,614 | A | 11/1989 | Strangman et al. |
| 5,415,756 | A | 5/1995 | Wolfe et al. |
| 5,837,058 | A | 11/1998 | Chen et al. |
| 6,326,076 | B1 | 12/2001 | Takai |
| 6,530,990 | B2 | 3/2003 | Kong et al. |
| 6,606,234 | B1 | 8/2003 | Divakar |
| 6,949,203 | B2 | 9/2005 | Hsieh et al. |
| 7,351,482 | B2 | 4/2008 | Boutwell et al. |
| 7,479,464 | B2 | 1/2009 | Sun et al. |
| 7,672,110 | B2 | 3/2010 | Sun et al. |
| 7,696,117 | B2 | 4/2010 | Sun et al. |
| 7,718,559 | B2 | 5/2010 | Yuan et al. |
| 8,034,734 | B2 | 10/2011 | Sun et al. |
| 8,067,067 | B2 | 11/2011 | Sun et al. |
| 8,129,029 | B2 | 3/2012 | Sun et al. |
| 8,206,829 | B2 | 6/2012 | Sun et al. |
| 8,367,227 | B2 | 2/2013 | Sun et al. |
| 8,623,527 | B2 | 1/2014 | Sun et al. |
| 8,758,858 | B2 | 6/2014 | Sun et al. |
| 8,916,021 | B2 | 12/2014 | Sun et al. |
| 8,941,969 | B2 | 1/2015 | Thach et al. |
| 9,017,765 | B2 | 4/2015 | Sun et al. |
| 9,034,199 | B2 | 5/2015 | Duan et al. |
| 9,051,219 | B2 | 6/2015 | Sun et al. |
| 9,090,046 | B2 | 7/2015 | Sun et al. |
| 9,212,099 | B2 | 12/2015 | Sun et al. |
| 9,976,211 | B2 | 5/2018 | Firouzdor |
| 2002/0018921 | A1 | 2/2002 | Yamada et al. |
| 2002/0043666 | A1 | 4/2002 | Parsons et al. |
| 2003/0024807 | A1 | 2/2003 | Baldwin et al. |
| 2003/0029563 | A1 | 2/2003 | Kaushal et al. |
| 2003/0047464 | A1 | 3/2003 | Sun et al. |
| 2003/0164354 | A1 | 9/2003 | Hsieh et al. |
| 2003/0175142 | A1 | 9/2003 | Milonopoulou et al. |
| 2004/0002221 | A1 | 1/2004 | O'Donnell et al. |
| 2004/0157473 | A1 | 8/2004 | Hayashi et al. |
| 2004/0191545 | A1 | 9/2004 | Han et al. |
| 2004/0216667 | A1 | 11/2004 | Mitsuhashi et al. |
| 2005/0037193 | A1 | 2/2005 | Sun et al. |
| 2005/0164513 | A1 | 7/2005 | DeOrnellas et al. |
| 2005/0181566 | A1 | 8/2005 | Machida et al. |
| 2006/0081939 | A1 | 4/2006 | Akasaka et al. |
| 2006/0090704 | A1 | 5/2006 | Ide et al. |
| 2006/0073354 | A1 | 6/2006 | Watanabe et al. |
| 2007/0047170 | A1 | 3/2007 | Sun et al. |
| 2008/0029032 | A1 | 2/2008 | Sun et al. |
| 2008/0066683 | A1 | 3/2008 | Fujimura et al. |
| 2008/0108225 | A1 | 5/2008 | Sun et al. |
| 2008/0213496 | A1 | 9/2008 | Sun et al. |
| 2008/0237029 | A1 | 10/2008 | Tang et al. |
| 2008/0261800 | A1 | 10/2008 | Yuan et al. |
| 2008/0264564 | A1 | 10/2008 | Sun et al. |
| 2008/0264565 | A1 | 10/2008 | Sun et al. |
| 2008/0268171 | A1 | 10/2008 | Ma et al. |
| 2009/0036292 | A1 | 2/2009 | Sun et al. |
| 2009/0142588 | A1 | 6/2009 | Ohmi et al. |
| 2009/0162647 | A1 | 6/2009 | Sun et al. |
| 2009/0214825 | A1 | 8/2009 | Sun et al. |
| 2010/0119843 | A1 | 5/2010 | Sun et al. |
| 2010/0129670 | A1 | 5/2010 | Sun et al. |
| 2010/0160143 | A1 | 6/2010 | Sun et al. |
| 2010/0200545 | A1 | 8/2010 | Koelmel et al. |
| 2010/0304571 | A1 | 12/2010 | Larson et al. |
| 2011/0086178 | A1 | 4/2011 | Ruud et al. |
| 2011/0198034 | A1 | 8/2011 | Sun et al. |
| 2011/0303154 | A1 | 12/2011 | Kim et al. |
| 2011/0315081 | A1 | 12/2011 | Law et al. |
| 2012/0024449 | A1 | 2/2012 | Ricci et al. |
| 2012/0034469 | A1 | 2/2012 | Sun et al. |
| 2012/0104703 | A1 | 5/2012 | Sun et al. |
| 2012/0125488 | A1 | 5/2012 | Sun et al. |
| 2012/0144640 | A1 | 6/2012 | Shih et al. |
| 2012/0196139 | A1 | 8/2012 | Petorak et al. |
| 2013/0048606 | A1 | 2/2013 | Mao et al. |
| 2013/0130052 | A1 | 5/2013 | Menuey et al. |
| 2013/0156958 | A1 | 6/2013 | Belov et al. |
| 2013/0174983 | A1 | 7/2013 | Kikuchi et al. |
| 2013/0216783 | A1 | 8/2013 | Duan et al. |
| 2013/0216821 | A1 | 8/2013 | Sun et al. |
| 2013/0224498 | A1 | 8/2013 | Sun et al. |
| 2013/0239882 | A1 | 9/2013 | Bramhall, Jr. et al. |
| 2013/0273313 | A1 | 10/2013 | Sun et al. |
| 2013/0273327 | A1 | 10/2013 | Sun et al. |
| 2013/0284373 | A1 | 10/2013 | Sun et al. |
| 2013/0288037 | A1 | 10/2013 | Sun et al. |
| 2013/0333592 | A1 | 12/2013 | Nakagawa et al. |
| 2014/0030486 | A1 | 1/2014 | Sun et al. |
| 2014/0030533 | A1 | 1/2014 | Sun et al. |
| 2014/0031533 | A1 | 1/2014 | Liu et al. |
| 2014/0037969 | A1 | 2/2014 | Margolies et al. |
| 2014/0154465 | A1 | 6/2014 | Sun et al. |
| 2014/0177123 | A1 | 6/2014 | Thach et al. |
| 2014/0203526 | A1 | 7/2014 | Banda et al. |
| 2014/0221188 | A1 | 8/2014 | Banda et al. |
| 2014/0302680 | A1 | 10/2014 | Singh et al. |
| 2014/0349073 | A1 | 11/2014 | Sun et al. |
| 2014/0363596 | A1 | 12/2014 | Sun et al. |
| 2014/0377504 | A1 | 12/2014 | Sun et al. |
| 2015/0021324 | A1 | 1/2015 | Sun et al. |
| 2015/0024155 | A1 | 1/2015 | Sun et al. |
| 2015/0064450 | A1 | 3/2015 | Sun et al. |
| 2015/0075714 | A1 | 3/2015 | Sun et al. |
| 2015/0079370 | A1 | 3/2015 | Sun et al. |
| 2015/0132602 | A1 | 5/2015 | Sun et al. |
| 2015/0133285 | A1 | 5/2015 | Sun et al. |
| 2015/0158775 | A1 | 6/2015 | Sun et al. |
| 2015/0218057 | A1 | 8/2015 | Duan et al. |
| 2015/0270108 | A1 | 9/2015 | Sun et al. |
| 2015/0299050 | A1 | 10/2015 | Sun et al. |
| 2015/0307982 | A1 | 10/2015 | Firouzdor et al. |
| 2015/0311043 | A1 | 10/2015 | Sun et al. |
| 2015/0311044 | A1 | 10/2015 | Sun et al. |
| 2015/0321964 | A1 | 11/2015 | Sun et al. |
| 2015/0329430 | A1 | 11/2015 | Sun et al. |
| 2015/0329955 | A1 | 11/2015 | Sun et al. |
| 2016/0042924 | A1 | 2/2016 | Kim et al. |

FOREIGN PATENT DOCUMENTS

| | | |
|---|---|---|
| JP | 2007-138288 | 6/2007 |
| JP | 2007-191794 | 8/2007 |
| JP | 2009231448 | 10/2009 |
| KR | 10-2003-0025007 | 3/2003 |
| KR | 10-2007-0013118 | 1/2007 |
| KR | 10-1108692 | 1/2012 |
| WO | 2002/000968 | 1/2002 |
| WO | 0221590 | 3/2002 |

(56) References Cited

FOREIGN PATENT DOCUMENTS

WO      2009108275 A2     9/2009
WO      2012/033326        3/2012

OTHER PUBLICATIONS

Kitamura et al., "Structural, Mechanical and Erosion Properties of Yttrium Oxide Coatings by Axial Suspension Plasma Spraying for Electronics Applications," Journal of Thermal Spray Technology, 20:170-185, Jan. 2011.

Refke, et al "LPPS thin film technology for the application of TBC systems", International Thermal Spray Conference, Basel Switzerland, May 2-4, 2005, 6 pages.

Lewis, Richard J.Sr., editor; Hawley's Condensed Chemical Dictionary, 12th edition, 1993, pp. 540 & 990, Van Nostrand Reinhold company, New York.

Machine translation of KR10-1108692 B1 by Park et al., issued Jan. 25, 2012.

International Search Report & Written Opinion of the International Searching Authority dated Jul. 31, 2015, in International Application No. PCT/US2015/027345.

PLASMA EROSION RESISTANT THIN FILM COATING FOR HIGH TEMPERATURE APPLICATION

RELATED APPLICATIONS

This patent application is a continuation U.S. application Ser. No. 15/954,455, filed Apr. 16, 2018, which is a continuation of U.S. application Ser. No. 14/693,745, filed Apr. 22, 2015, which claims the benefit under 35 U.S.C. § 119(e) of U.S. Provisional Application No. 61/984,691, filed Apr. 25, 2014, the disclosures of which are hereby incorporated by reference herein in their entireties.

TECHNICAL FIELD

Embodiments of the present invention relate, in general, to protecting chamber components that are frequently exposed to high temperatures and to direct or remote plasma environments.

BACKGROUND

In the semiconductor industry, devices are fabricated by a number of manufacturing processes producing structures of an ever-decreasing size. Some manufacturing processes such as plasma etch and plasma clean processes expose a substrate to a high-speed stream of plasma to etch or clean the substrate. The plasma may be highly corrosive, and may corrode processing chambers and other surfaces that are exposed to the plasma. Accordingly, plasma sprayed protective coatings are commonly used to protect the processing chamber components from corrosion.

Some manufacturing processes are performed at high temperatures (e.g., temperatures of over 400° C.). Traditional plasma sprayed protective coatings may be inappropriate for some chamber components that are used for such processes.

SUMMARY

In an example embodiment, an article includes a body having a thermally conductive material. The article further includes a first protective layer on a surface of the body, the first protective layer being a thermally conductive ceramic. The article further includes a second protective layer on the first protective layer, the second protective layer comprising a plasma resistant ceramic thin film that is resistant to cracking at temperatures of up to 650 degrees Celsius.

In another example embodiment, a method includes providing an article comprising a thermally conductive material body. The method further includes depositing a first protective layer on a surface of the thermally conductive material body, the first protective layer being a thermally conductive ceramic. The method further includes performing ion assisted deposition to deposit a second protective layer over the first protective layer, the second protective layer comprising a plasma resistant ceramic thin film that is resistant to cracking at temperatures of up to 650 degrees Celsius.

In another example embodiment, a susceptor for an atomic layer deposition chamber includes a graphite body. The susceptor further includes a first protective layer on a surface of the graphite body, the first protective layer comprising silicon carbide. The susceptor further includes a second protective layer on the first protective layer, the second protective layer comprising a plasma resistant ceramic thin film that is resistant to cracking at temperatures of room temperature up to 650 degrees Celsius, wherein the second protective layer comprises a ceramic selected from the group consisting of $Er_3Al_5O_{12}$, $Y_3Al_5O_{12}$ and $YF_3$.

BRIEF DESCRIPTION OF THE DRAWINGS

The present invention is illustrated by way of example, and not by way of limitation, in the figures of the accompanying drawings in which like references indicate similar elements. It should be noted that different references to "an" or "one" embodiment in this disclosure are not necessarily to the same embodiment, and such references mean at least one.

DETAILED DESCRIPTION OF EMBODIMENTS

Embodiments of the present invention provide an article such as a chamber component for an atomic layer deposition (ALD) chamber having a thin film protective layer on one or more surfaces of the article. The protective layer may have a thickness below approximately 50 microns, and may provide plasma corrosion resistance for protection of the article. The chamber component may be exposed to high temperatures during processing of wafers. For example, the chamber component may be exposed to temperatures in excess of 450° C. The thin film protective layer is formed in such a manner as to be resistant or effectively immune to cracking at these high temperatures. The thin film protective layer may be a dense, conforming thin film deposited on a heated substrate using ion assisted deposition (IAD). The thin film protective layer may be formed of $Y_3Al_5O_{12}$, $Er_3Al_5O_{12}$, or $YF_3$. The improved erosion resistance provided by the thin film protective layer may improve the service life of the article, while reducing maintenance and manufacturing cost.

Figure 1:
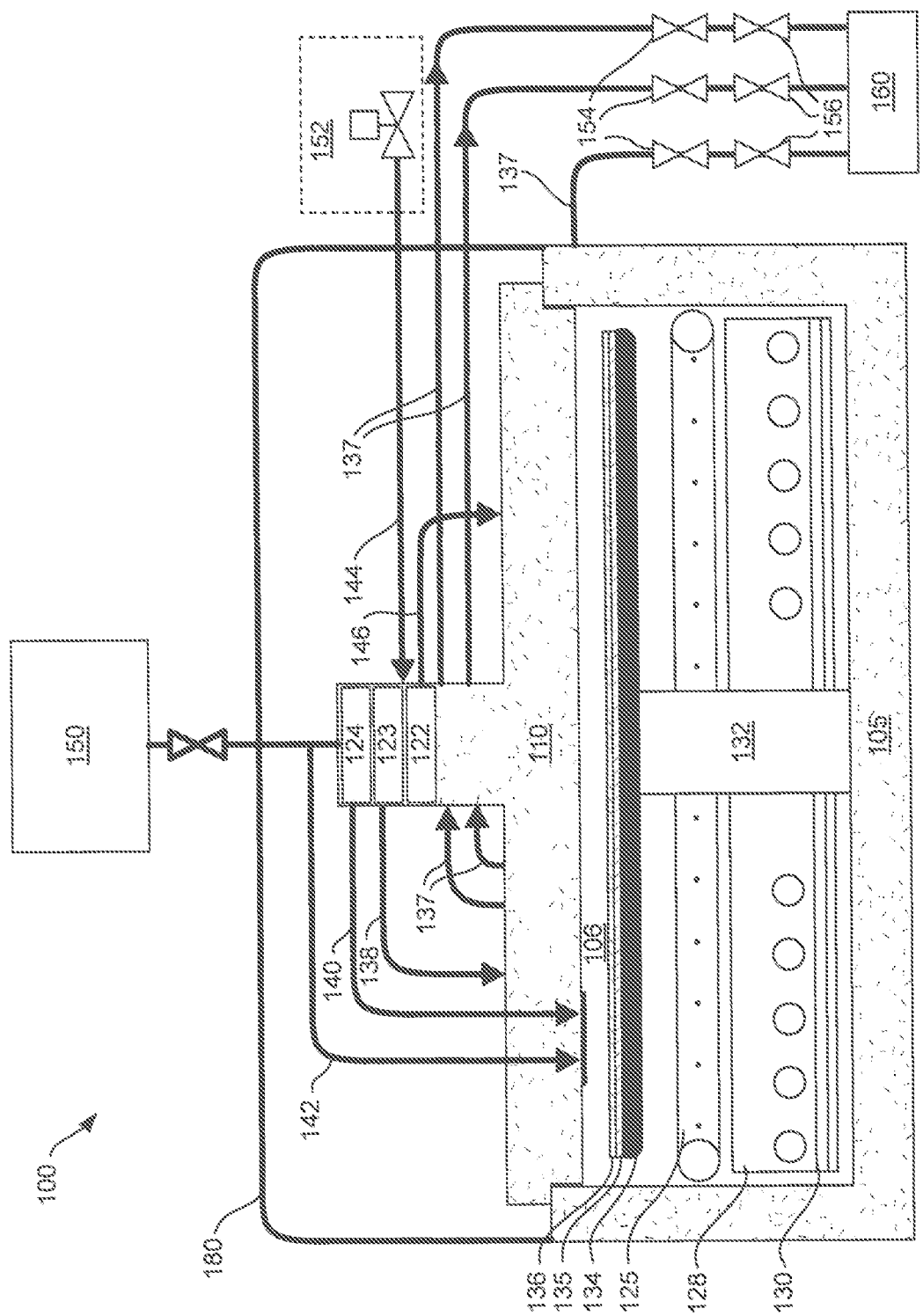
FIG. 1 depicts a sectional view of one embodiment of a processing chamber.

FIG. 1 is a sectional view of a processing chamber 100 having one or more chamber components that are coated with a thin film protective layer in accordance with embodiments of the present invention. The processing chamber 100 may be an ALD processing chamber. In one embodiment, the processing chamber 100 utilizes a remote plasma unit to deliver fluorine radicals (F*) into the processing chamber 100 for chamber cleaning. Alternatively, other types of processing chambers may be used with embodiments described herein.

The processing chamber 100 may be used for high temperature ALD processes. For example, the processing chamber 100 may be used for the deposition of titanium nitride (TiN). The TiN deposition process is typically an ALD process performed at temperatures at or above 450° C. Another example high temperature ALD process is the deposition of dichlorosilane (DCS) tungsten silicide. The DCS tungsten silicide process is performed by a reaction of $WF_6$, DCS and $SiH_4$ at temperatures of about 500-600° C. Other high temperature ALD processes may be performed by the processing chamber 100.

Examples of chamber components that may include a thin film protective layer include a susceptor 134, a chamber body 105, a showerhead 110, and so on. The thin film protective layer, which is described in greater detail below, may include $Y_3Al_5O_{12}$ (YAG), $Er_3Al_5O_{12}$ (EAG), and/or $YF_3$. The thin film protective layer may also include other ceramics in some embodiments. Additionally, the thin film protective layer may be one layer in a protective layer stack. As illustrated, the susceptor 134 has a thin film protective layer (second protective layer 136), in accordance with one embodiment. However, it should be understood that any of the other chamber components, such as those listed above, may also include a thin film protective layer.

In one embodiment, the processing chamber 100 includes a chamber body 105 and a showerhead 110 that enclose an interior volume 106. The chamber body 105 may be fabricated from aluminum, stainless steel or other suitable material. The chamber body 105 generally includes sidewalls and a bottom. Any of the showerhead 110, sidewalls and/or bottom may include a thin film protective layer.

A chamber exhaust 125 and one or more exhaust ports 137 may vent exhaust out of the interior volume 106 of the chamber. The exhaust ports 137 may be connected to a pump system that includes one or more pumps 160 and throttle valves 156 and/or gate valves 154 utilized to evacuate and regulate the pressure of the interior volume 106 of the processing chamber 100.

The showerhead 110 may be supported on the sidewalls of the chamber body 105. The showerhead 110 (or lid) may be opened to allow access to the interior volume 106 of the processing chamber 100, and may provide a seal for the processing chamber 100 while closed. The showerhead 110 may include a gas distribution plate and one or more injectors 122, 123, 124. The showerhead 110 may be fabricated from aluminum, stainless steel, or other suitable material. Alternatively, the showerhead 110 may be replaced by a lid and a nozzle in some embodiments.

A gas panel 152 may provide process and/or cleaning gases to the interior volume 106 through the showerhead 110 via one or more gas delivery lines 138-146. Examples of processing gases that may be used to perform CVD operations to deposit layers on substrates include $NH_3$, $TiCl_4$, Tetrakis(dimethylamino)titanium (TDMAT), $WF_6$, DCS, $SiH_4$, and so on, depending on the layer to be deposited. A remote plasma source (RPS) 150 may generate Fluorine radicals (F*) during cleaning, and may deliver the Fluorine radicals via one or more gas delivery lines 138-146. The gas delivery lines 138-146, exhaust ports 137 and showerhead 110 may be covered by a dome 180, which may be aluminum or another suitable material.

Chamber components such the inner walls of the chamber body 105, the showerhead 110, the susceptor 134, etc. accumulate a deposited layer of materials during processing. To mitigate changes in deposition properties as well as particle contamination, such deposited layers are periodically cleaned from the chamber components using a remote plasma cleaning process. Examples of cleaning gases that may be used to clean deposited materials from the surfaces of chamber components include halogen-containing gases, such as $C_2F_6$, $SF_6$, $SiCl_4$, HBr, $NF_3$, $CF_4$, $CHF_3$, $CH_2F_3$, F, $NF_3$, $Cl_2$, $CCl_4$, $BCl_3$ and $SiF_4$, among others, and other gases such as $O_2$, or $N_2O$. Examples of carrier gases include $N_2$, He, Ar, and other gases inert to cleaning gases (e.g., non-reactive gases). In one embodiment, $NF_3$ and Ar are used to perform the plasma cleaning process.

The susceptor 134 is disposed in the interior volume 106 of the processing chamber 100 below the showerhead 110 and supported by a base 132. The susceptor 134 holds one or more substrates during processing. The susceptor 134 is configured to spin about an axial center during ALD processes so as to ensure the even distribution of process gases interacting with the one or more substrates. Such even distribution improves thickness uniformity of layers deposited on the one or more substrates.

The susceptor 134 is configured to be heated and to maintain a uniform heat throughout the susceptor 134 during processing. Accordingly, the susceptor 134 may have a body that is composed of a thermally conductive material that has a high resistance to thermal shock. In one embodiment, the body is a semimetal material such as graphite. The susceptor 134 may also have a body composed of other materials with a high thermal shock resistance, such as glass-carbon.

The susceptor 134 has multiple depressions. Each depression may be approximately the size of a substrate (e.g., a wafer) that is to be held in the depression. The substrate may be vacuum attached (chucked) to the susceptor 134 during processing.

In one embodiment, the body of the susceptor 134 has a first protective layer 135 on at least one surface and a second protective layer 136 over the first protective layer 135. In one embodiment, the first protective layer is SiC and the second protective layer is one of $Y_3Al_5O_{12}$ (YAG), $Er_3Al_5O_{12}$ (EAG), or $YF_3$. In another embodiment, the susceptor 134 has only a single protective layer that is one of $Y_3Al_5O_{12}$ (YAG), $Er_3Al_5O_{12}$ (EAG), or $YF_3$. In other embodiments, additional protective layers may also be used. One example susceptor is shown in greater detail with reference to FIGS. 2A-2B.

In one embodiment, one or more heating elements 130 are disposed below the susceptor 134. One or more heat shields may also be disposed near the heating elements 130 to protect components that should not be heated to high temperatures. In one embodiment, the heating elements 130 are resistive or inductive heating elements. In another embodiment, the heating elements are radiant heating lamps. The heating elements 130 may heat the susceptor 134 to temperatures of up to 700° C. or higher in some embodiments.

Figure 2A:
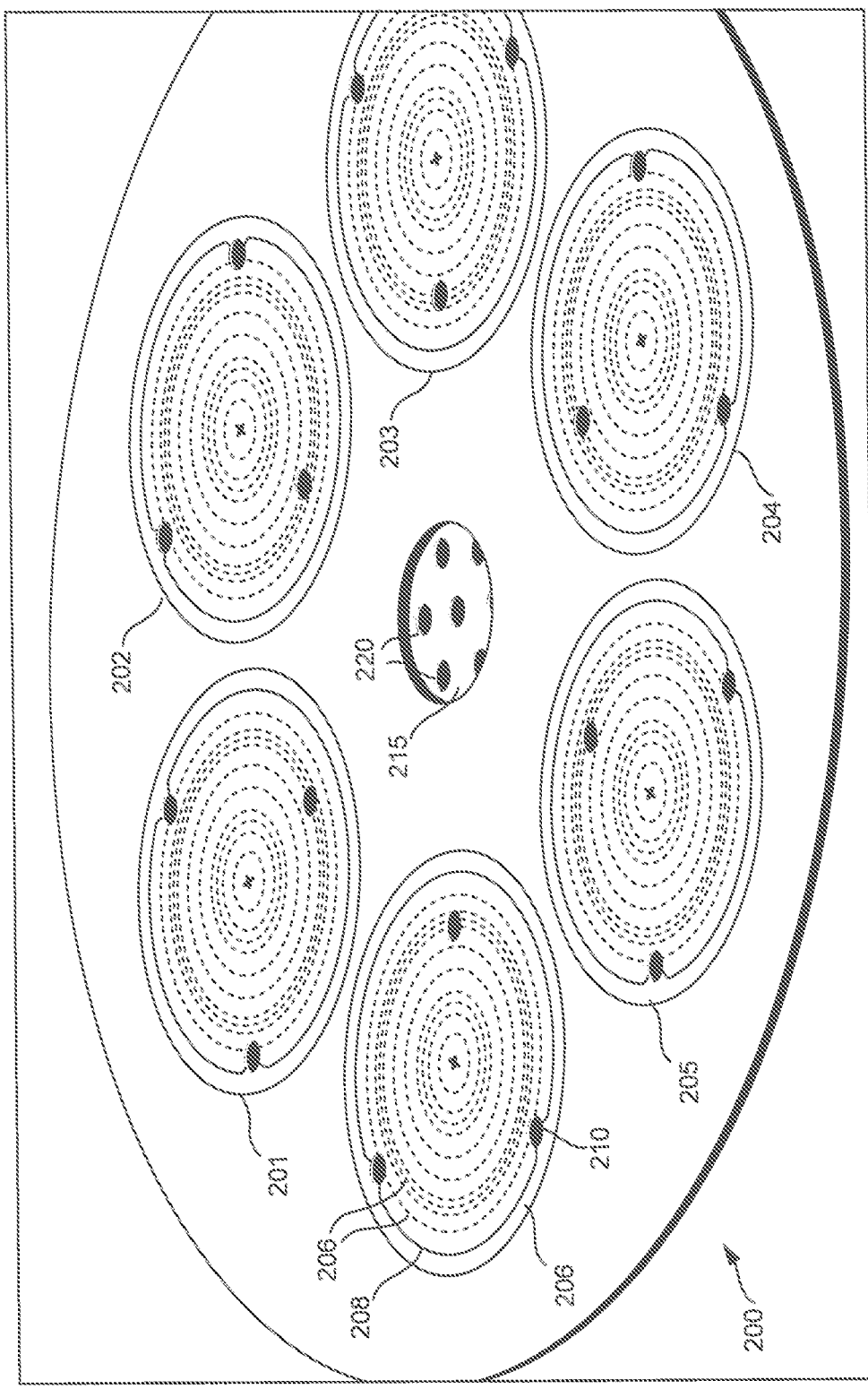
FIG. 2A depicts a susceptor for atomic layer deposition (ALD) with a thin film protective coating on one surface.

FIG. 2A depicts an example susceptor 200 for an ALD chamber. The susceptor 200 has a thin film protective coating. In one embodiment, the thin film protective coating coats just an upper surface of the susceptor. Alternatively, the thin film protective coating coats an upper and a lower surface of the susceptor. The thin film protective layer may also coat side walls of the susceptor. The purpose of the susceptor 200 is to support and uniformly heat multiple wafers simultaneously. The susceptor 200 may be heated radiatively using resistive heating elements or lamps. During processing, the susceptor 200 is coated (along with supported wafers) via an atomic monolayer deposition (ALD) or other CVD process. In order to increase the mean time between cleans (MTBC), the susceptor 200 should be periodically cleaned to prevent the coating from flaking due to internal film stresses developed during sequential processing. The susceptor 200 can be cleaned either by a thermal or remote plasma process. In the case of remote plasma clean using $NF_3$, fluorine radicals (F*) are generated remotely and are delivered into the process region to remove the deposition film. However, F* at high temperatures will also erode the susceptor material (e.g., CVD SiC and graphite). Therefore, a protective coating is applied that is erosion resistant to the chemistry used. The protective coating also allows for a period of "over etch" to ensure that the entirety of the deposition film is removed.

In one embodiment, the susceptor 200 includes a semi-metal thermally conductive base such as graphite. The susceptor 200 may have a disc-like shape that may be large enough to support multiple substrates (e.g., multiple wafers). In one embodiment, the susceptor has a diameter of over 1 meter.

The susceptor 200 may include one or more depressions (also referred to as pockets) 201-206, each of which may be configured to support a wafer or other substrate during processing. In the illustrated example the susceptor 200 includes 6 depressions 201-206. However, other susceptors may have more or fewer depressions.

Each of the depressions 201-206 includes many surface features. Examples of surface features in depression 201 include an outer ring 208, multiple mesas 206 and channels or gas passages between the mesas 206. The features may have heights of approximately 10-80 microns in some embodiments.

In one embodiment, the susceptor 200 further includes a CVD deposited layer of SiC or SiN over one or more surfaces of the thermally conductive semimetal base. The depressions 201-206 and surface features (e.g., mesas 206 and outer ring 208) may be fluidly coupled to a source of a heat transfer (or backside) gas, such as He via holes drilled in the susceptor 200. In operation, the backside gas may be provided at controlled pressure into the gas passages to enhance the heat transfer between the susceptor 200 and a substrate.

The depressions and surface features may be formed in the body of the susceptor 200 before the first protective layer is deposited. Alternatively, the depressions and/or surface features may be formed in the first protective layer after the first protective layer is deposited thereon. The second protective layer may be a conforming thin film protective layer that conforms to the depressions and surface features. Alternatively, the surface features may be formed in the second protective layer. Accordingly, all of the surface features (e.g., mesas 206 and outer ring 208) are present at the surface of the second protective layer. In one embodiment, the second protective layer has a thickness of about 5-50 microns. In another embodiment, the second protective layer has a thickness of below 20 microns. In another embodiment, the second protective layer has a thickness of up to 1000 microns.

The susceptor 200 additionally includes lift pin holes 210. For example, the susceptor 200 may include three lift pin holes that support lift pins (e.g., $Al_2O_3$ lift pins). The lift pins enable the loading and unloading of wafers onto the susceptor 200. Susceptor 200 may include a depression 215 that may be used to clamp the susceptor to a rotating spindle. The depression 215 may include holes 220, which may be used to mechanically fasten the susceptor 200 to the rotating spindle.

Figure 2B:
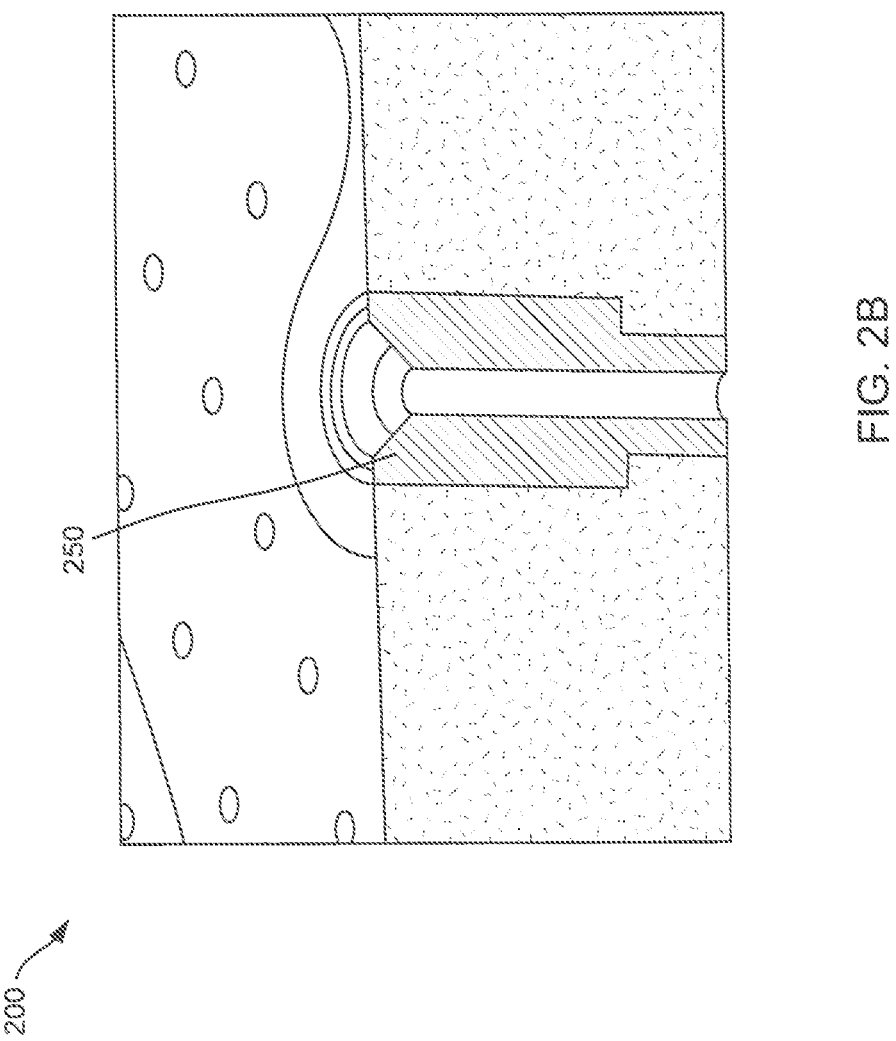
FIG. 2B depicts a zoomed in cross sectional view of a susceptor for an atomic layer deposition chamber with a plasma resistant plug inserted into a hole.

FIG. 2B depicts a zoomed in cross sectional view of susceptor 200 with a plasma resistant plug 250 inserted into a hole. IAD and PVD are line of sight processes. Accordingly, the thin film protective coating may not coat the insides of holes in the susceptor (e.g., lift pin holes 210, holes 220 or helium holes). In one embodiment, initial holes are formed in the susceptor with oversize dimensions. Plasma resistant plugs (e.g., plasma resistant plug 250) may be separately manufactured and inserted into the oversized holes. The plasma resistant plugs 250 may be press fit (e.g., mechanically pressed) into the oversized holes. The plasma resistant plugs 250 may be formed from bulk sintered plasma resistant ceramic materials such as AlN, $Y_2O_3$, a ceramic compound comprising $Y_4Al_2O_9$ and a solid-solution of $Y_2O_3$—$ZrO_2$, or another rare earth oxide.

The plasma resistant plugs 250 may themselves have final holes at their center, where the final holes have a desired diameter. The CVD deposited layer and/or the thin film protective layer may coat just the susceptor, or both the susceptor and the plasma resistant plugs 250. In one embodiment, the CVD deposited layer is deposited before the plasma resistant plugs 250 are inserted. The thin film protective layer may then be deposited after insertion of the plasma resistant plugs 250. The thin film protective layer may fill and/or bridge any gaps between an outer wall of a plug 250 and the initial hole into which it was inserted. In some instances the thin film protective layer may not be thick enough to bridge a gap between a plug and an initial hole that the plug is inserted into. Accordingly, the CVD coating may be deposited after the plug is inserted to bridge any gaps. The thin film protective layer may then be deposited over the CVD coating.

In one embodiment, a base of the plasma resistant plugs is narrower than a top of the plasma resistant plugs (as shown). This enables the plasma resistant plugs to be press fit to a predetermined depth into the susceptor 200.

Figure 3:
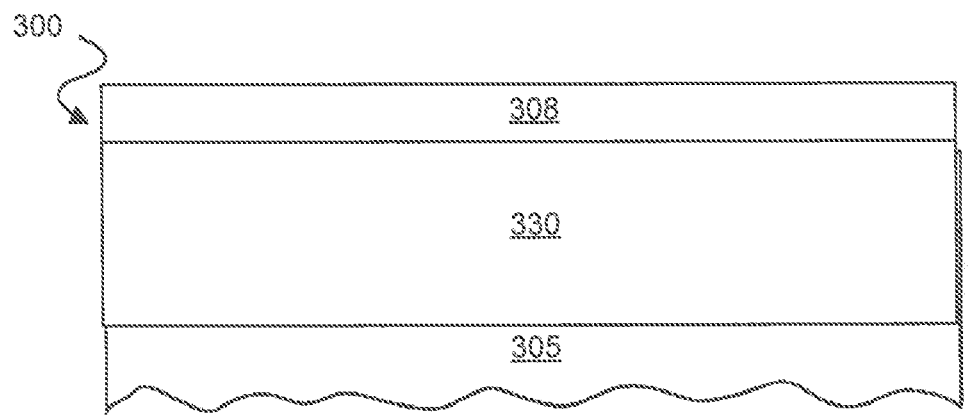
FIGS. 3-5 depict cross sectional side views of example articles with protective layer stacks on one surface.
Figure 4:
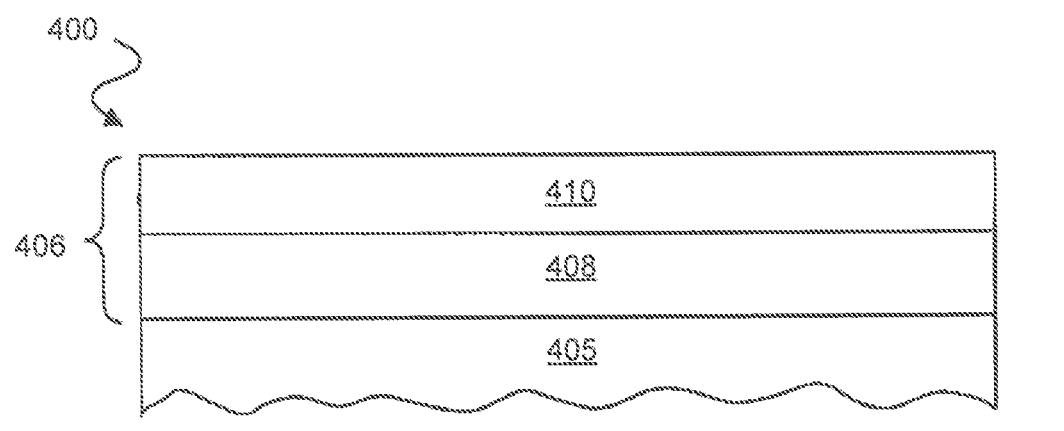
Figure 5:
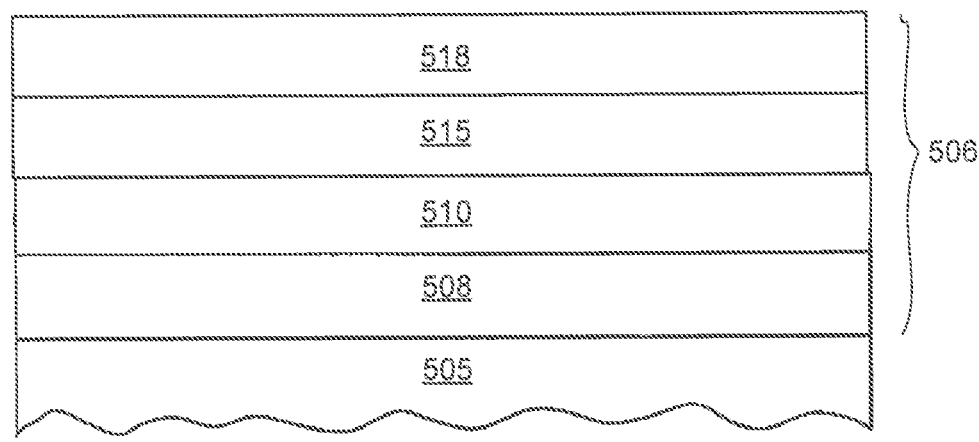

FIGS. 3-5 illustrate cross sectional side views of articles (e.g., chamber components) covered by one or more thin film protective layers. FIG. 3 illustrates a cross sectional side view of one embodiment of an article 300 having a first protective layer 330 and a second protective layer 308. The first protective layer may be SiC, SiN, or another ceramic material. The first protective layer 330 may have been deposited onto the body 305 by a CVD process. The first protective layer may have a thickness of up to 200 microns. In one embodiment, the first protective layer is approximately 5-100 microns thick.

The second protective layer 308 may be a ceramic thin film protective layer applied over the first protective layer 330 using IAD. Two example IAD processes that may be used to deposit the second protective layer 308 include electron beam IAD (EB-IAD) and ion beam sputtering IAD (IBS-IAD). The second protective layer 308 may act as a top coat, and may act as an erosion resistant barrier and seal an exposed surface of the first protective layer 330 (e.g., seal inherent surface cracks and pores in the first protective layer 330).

The IAD deposited second protective layer 308 may have a relatively low film stress (e.g., as compared to a film stress caused by plasma spraying or sputtering). The IAD deposited second protective layer 308 may additionally have a porosity that is less than 1%, and less than about 0.1% in some embodiments. Therefore, the IAD deposited protective layer is a dense structure, which can have performance benefits for application on a chamber component. Additionally, the IAD deposited second protective layer 308 may be deposited without first roughening the first protective layer 330 or performing other time consuming surface preparation steps.

Examples of ceramics that may be used to form the second protective layer 308 include $Y_3Al_5O_{12}$ (YAG), $Er_3Al_5O_{12}$ (EAG), and $YF_3$. Another example ceramic that may be used is $Y_4Al_2O_9$ (YAM). Any of the aforementioned ceramics may include trace amounts of other materials such as $ZrO_2$, $Al_2O_3$, $SiO_2$, $B_2O_3$, $Er_2O_3$, $Nd_2O_3$, $Nb_2O_5$, $CeO_2$, $Sm_2O_3$, $Yb_2O_3$, or other oxides.

The body 305 of the article 300 and/or the first protective layer 330 may include one or more surface features. For a susceptor, surface features may include depressions, mesas, sealing bands, gas channels, helium holes, and so forth. For a showerhead, surface features may include hundreds or thousands of holes for gas distribution, divots or bumps around gas distribution holes, and so forth. Other chamber components may have other surface features.

The second protective layer 308 may conform to the surface features of the body 305 and first protective layer 330. For example, the second protective layer 308 may maintain a relative shape of the upper surface of the first protective layer 330 (e.g., telegraphing the shapes of the features in the first protective layer 330). Additionally, the second protective layer 308 may be thin enough so as not to plug holes in the body 305 and/or first protective layer 330. The second protective layer may have a thickness of less than 1000 microns. In one embodiment, the second protective layer 308 has a thickness of below about 20 microns. In a further embodiment, the second protective layer has a thickness of between about 0.5 microns to about 7 microns.

In an alternative embodiment, the first protective layer 330 may be omitted. Accordingly, only a single protective layer of $Y_3Al_5O_{12}$ (YAG), $Er_3Al_5O_{12}$ (EAG), $YF_3$ or $Y_4Al_2O_9$ (YAM) may be deposited over one or more surfaces of the body 305.

each of the identified ceramic materials. Adhesion strength may be determined by measuring the amount of force used to separate the thin film protective layer from the substrate.

Hermicity measures the sealing capacity that can be achieved using the thin film protective layer. As shown, a He leak rate of around 2.6E-9 cubic centimeters per second ($cm^3/s$) can be achieved using $YF_3$, a He leak rate of around 4.4E-10 can be achieved using YAG, and a He leak rate of around 9.5E-10 can be achieved using EAG. Lower He leak rates indicate an improved seal. Each of the example thin film protective layers has a lower He leak rate than typical $Al_2O_3$.

Each of $Y_3Al_5O_{12}$, $Y_4Al_2O_9$, $Er_3Al_5O_{12}$, and $YF_3$ have a hardness that may resist wear during plasma processing. As shown, $YF_3$ has a Vickers hardness (5 Kgf) of around 3.411 Giga pascals (GPa), YAG has a hardness of around 8.5 GPa, and EAG has a hardness of around 9.057 GPa. A measured wear rate of YAG is around 0.28 nanometers per radio frequency hour (nm/RFhr), and a wear rate of EAG is about 0.176 nm/RFhr.

Note that the $Y_3Al_5O_{12}$, $Y_4Al_2O_9$, $Er_3Al_5O_{12}$, and $YF_3$ may be modified such that the material properties and characteristics identified above may vary by up to 30% in some embodiments. Accordingly, the described values for these material properties should be understood as example achievable values. The ceramic thin film protective layers described herein should not be interpreted as being limited to the provided values.

TABLE 1

Material properties for IAD deposited YAM, $YF_3$, YAG and EAG.

| Property | YAM | $YF_3$ | YAG | EAG |
|---|---|---|---|---|
| Breakdown Voltage (V/5 μm coating) | 695 | 522 | 1080 | 900 |
| Dielectric Constant Stack over 1.6 mm Alumina | | 9.2 | 9.76 +/− 0.01 | 9.54 |
| Loss Tangent Stack over 1.6 mm Alumina | | 9E−4 | 4E−4 | 4E−4 |
| Thermal Conductivity (W/m-K) Stack over 1.6 mm Alumina | | | 20.1 | 19.2 |
| Adhesion Over 92% $Al_2O_3$ (MPa) | >27 | >27 | >27 | >27 |
| Hermicity (leak rate) ($cm^3/s$) | <1E−10 | 2.6E−9 | 4.4E−10 | 9.5E−10 |
| Hardness (GPa) | | 3.411 | 8.5 | 9.057 |
| Wear Rate (nm/RFhr) | | | 0.28 | 0.176 |
| Crystal Structure | A | A | A | A |

Table 1 shows material properties for IAD deposited YAM, $YF_3$, YAG and EAG. As shown, a 5 micron (μm) coating of IAD deposited YAM has a breakdown voltage of 695 Volts (V). A 5 μm coating of the IAD deposited $YF_3$ has a breakdown voltage of 522 V. A 5 μm coating of the IAD deposited YAG has a breakdown voltage of 1080 V. A 5 μm coating of the IAD deposited EAG has a breakdown voltage of 900 V.

A dielectric constant of the $YF_3$ over 1.6 mm of Alumina is about 9.2, a dielectric constant of the YAG thin film is about 9.76, and a dielectric constant of the EAG thin film is about 9.54. A loss tangent of the $YF_3$ thin film over 1.6 mm of Alumina is about 9E-4, a loss tangent of the YAG thin film is about 4E-4, and a loss tangent of the EAG thin film is about 4E-4. A thermal conductivity of the YAG thin film is about 20.1 W/m-K, and a thermal conductivity of the EAG thin film is about 19.2 W/m-K.

Adhesion strength of the thin film protective layers to an alumina substrate may be above 27 mega pascals (MPa) for FIG. 4 illustrates a cross sectional side view of one embodiment of an article 400 having a thin film protective layer stack 406 deposited over a body 405 of the article 400. In an alternative embodiment, the thin film protective layer stack 406 may be deposited over a first protective layer of SiC or SiN.

One or more thin film protective layer (e.g., first layer 408 and/or second layer 410) in the thin film protective layer stack 406 may be one of YAG, YAM, EAG or $YF_3$. Additionally, some of the protective layers may include $Er_2O_3$, $Gd_2O_3$, $Gd_3Al_5O_{12}$, or a ceramic compound comprising $Y_4Al_2O_9$ and a solid-solution of $Y_2O_3$—$ZrO_2$. In one embodiment, the same ceramic material is not used for two adjacent thin film protective layers. However, in another embodiment adjacent layers may be composed of the same ceramic.

FIG. 5 illustrates a cross sectional side view of another embodiment of an article 500 having a thin film protective layer stack 506 deposited over a body 505 of the article 500.

Alternatively, the thin film protective layer stack 506 may be deposited over a SiC or SiN layer. Article 500 is similar to article 400, except that thin film protective layer stack 506 has four thin film protective layers 508, 510, 515, 518.

The thin film protective layer stacks (such as those illustrated) may have any number of thin film protective layers. The thin film protective layers in a stack may all have the same thickness, or they may have varying thicknesses. Each of the thin film protective layers may have a thickness of less than approximately 50 microns, and less than approximately 10 microns in some embodiments. In one example, a first layer 408 may have a thickness of 3 microns, and a second layer 410 may have a thickness of 3 microns. In another example, first layer 508 may be a YAG layer having a thickness of 2 microns, second layer 510 may be a compound ceramic layer having a thickness of 1 micron, third layer 515 may be a YAG layer having a thickness of 1 micron, and fourth layer 518 may be a compound ceramic layer having a thickness of 1 micron.

The selection of the number of ceramic layers and the composition of the ceramic layers to use may be based on a desired application and/or a type of article being coated. EAG, YAG and $YF_3$ thin film protective layers formed by IAD typically have an amorphous structure. In contrast, IAD deposited compound ceramic and $Er_2O_3$ layers typically have a crystalline or nano-crystalline structure. Crystalline and nano-crystalline ceramic layers may generally be more erosion resistant than amorphous ceramic layers. However, in some instances thin film ceramic layers having a crystalline structure or nano-crystalline structure may experience occasional vertical cracks (cracks that run approximately in the direction of the film thickness and approximately perpendicular to the coated surface). Such vertical cracks may be caused by lattice mismatch and may be points of attack for plasma chemistries. Each time the article is heated and cooled, the mismatch in coefficients of thermal expansion between the thin film protective layer and the substrate that it coats cause stress on the thin film protective layer. Such stress may be concentrated at the vertical cracks. This may cause the thin film protective layer to eventually peel away from the substrate that it coats. In contrast, if there are not vertical cracks, then the stress is approximately evenly distributed across the thin film.

Accordingly, in one embodiment a first layer 408 in the thin film protective layer stack 406 is an amorphous ceramic such as YAG or EAG, and the second layer 410 in the thin film protective layer stack 406 is a crystalline or nano-crystalline ceramic such as the ceramic compound or $Er_2O_3$. In such an embodiment, the second layer 410 may provide greater plasma resistance as compared to the first layer 408. By forming the second layer 410 over the first layer 408 rather than directly over the body 405 (or over a SiC or SiN protective layer), the first layer 408 acts as a buffer to minimize lattice mismatch on the subsequent layer. Thus, a lifetime of the second layer 410 may be increased.

In another example, each of the body, $Y_3Al_5O_{12}$ (YAG), $Y_4Al_2O_9$, $Er_2O_3$, $Gd_2O_3$, $Er_3Al_5O_{12}$, $Gd_3Al_5O_{12}$, and the ceramic compound comprising $Y_4Al_2O_9$ and a solid-solution of $Y_2O_3$—$ZrO_2$ may have a different coefficient of thermal expansion. The greater the mismatch in the coefficient of thermal expansion between two adjacent materials, the greater the likelihood that one of those materials will eventually crack, peel away, or otherwise lose its bond to the other material. The protective layer stacks 406, 506 may be formed in such a way to minimize mismatch of the coefficient of thermal expansion between adjacent layers (or between a layer and a body 405, 505). For example, body 505 may be graphite, and EAG may have a coefficient of thermal expansion that is closest to that of graphite, followed by the coefficient of thermal expansion for YAG, followed by the coefficient of thermal expansion for the compound ceramic. Accordingly, first layer 508 may be EAG, second layer 510 may be YAG, and third layer 515 may be the compound ceramic in one embodiment.

In another example, the layers in the protective layer stack 506 may be alternating layers of two different ceramics. For example, first layer 508 and third layer 515 may be YAG, and second layer 510 and fourth layer 518 may be EAG or $YF_3$. Such alternating layers may provide advantages similar to those set forth above in cases where one material used in the alternating layers is amorphous and the other material used in the alternating layers is crystalline or nano-crystalline.

In another example, a thin film coating with a distinguishable color may be deposited at a point in the thin film protective layer stack 406 or 506. For example, the thin film coating with the distinguishable color may be deposited at a bottom of the thin film stack. The thin film coating with the distinguishable color may be, for example, $Er_2O_3$ or $SmO_2$. When a technician sees the distinguishable color, they may be alerted that the susceptor should be replaced or refurbished.

In some embodiments, one of more of the layers in the thin film protective layer stacks 406, 506 are transition layers formed using a heat treatment. If the body 405, 505 is a ceramic body, then a high temperature heat treatment may be performed to promote interdiffusion between a thin film protective layer and the body. Additionally, the heat treatment may be performed to promote interdiffusion between adjacent thin film protective layers or between a thick protective layer and a thin film protective layer. Notably, the transition layer may be a non-porous layer. The transition layer may act as a diffusion bond between two ceramics, and may provide improved adhesion between the adjacent ceramics. This may help prevent a protective layer from cracking, peeling off, or stripping off during plasma processing.

The thermal treatment may be a heat treatment at up to about 1400-1600 degrees C. for a duration of up to about 24 hours (e.g., 3-6 hours in one embodiment). This may create an inter-diffusion layer between a first thin film protective layer and one or more of an adjacent ceramic body, thick protective layer or second thin film protective layer.

Figure 6:
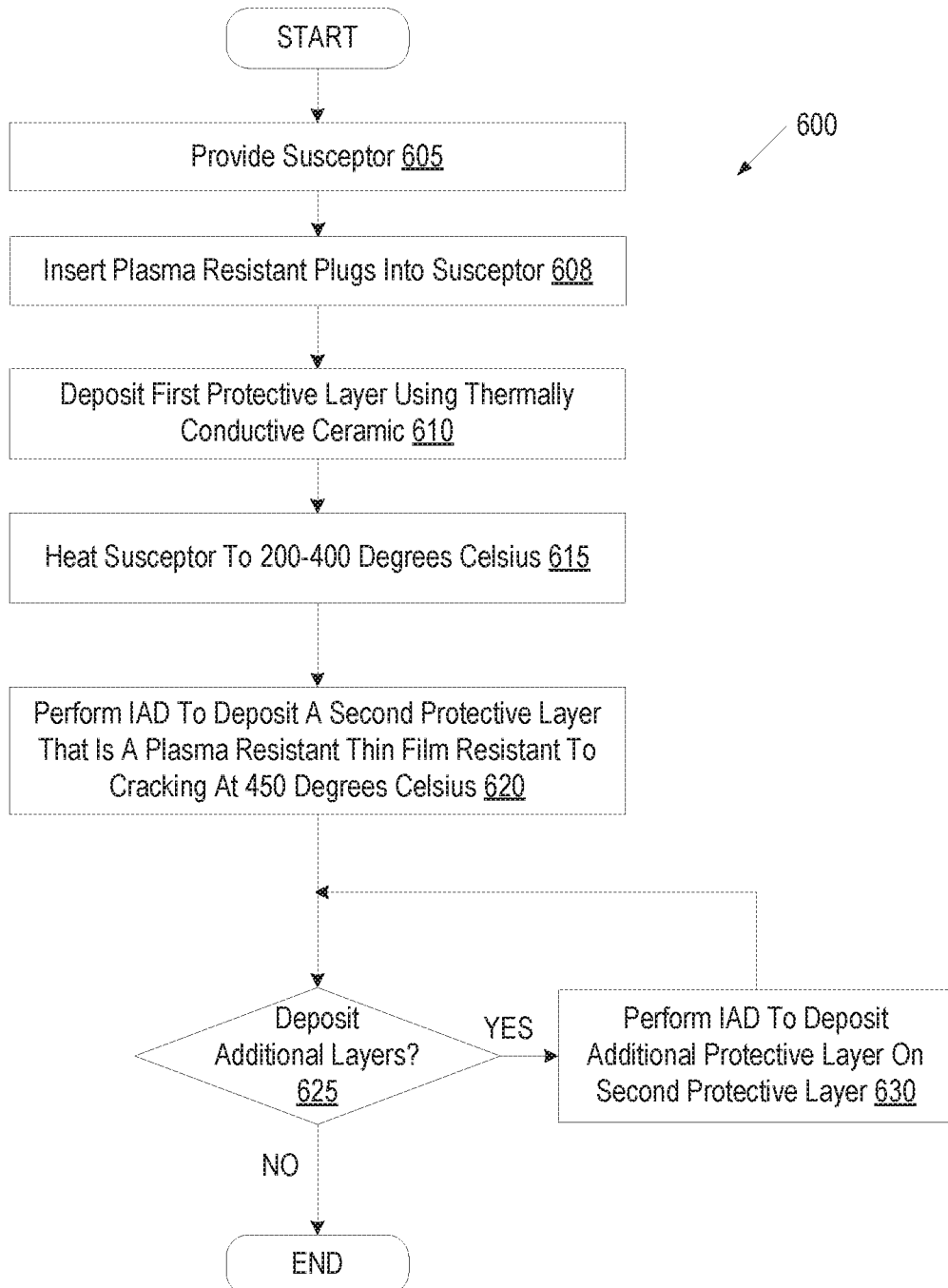
FIG. 6 illustrates one embodiment of a process for forming one or more protective layers over an article.

FIG. 6 illustrates one embodiment of a process 600 for forming one or more protective layers over an article. At block 605 of process 600, a susceptor is provided. The susceptor may be for an ALD processing chamber. In one embodiment, the susceptor has a thermally conductive semimetal body (a semimetal body with a good thermal conductivity). In one embodiment, the thermally conductive semimetal body is a graphite body. Alternatively, a non-thermally conductive susceptor may be provided. The non-thermally conductive susceptor may have a body composed of a carbon-glass. In other embodiments, articles other than a susceptor may be provided. For example, an aluminum showerhead for an ALD processing chamber may be provided.

In one embodiment, at block 608 plasma resistant ceramic plugs are inserted into holes in the susceptor. The plasma resistant ceramic plugs may be press fit into the holes. In an alternative embodiment, the plasma resistant ceramic plugs are inserted into the holes in the susceptor after block 610. In another embodiment, no plasma resistant ceramic plugs are inserted into the holes in the susceptor.

At block 610, a CVD process is performed to deposit a first protective layer over the provided susceptor. In one embodiment, the first protective layer covers only a plasma facing surface of the susceptor. In another embodiment, the first protective layer covers a front and back of the susceptor. In another embodiment, the first protective layer covers the front, back and sides of the susceptor. In one embodiment, the first protective layer is SiC. Alternatively, the first protective layer may be SiN, or another suitable material. The first protective layer may have a thickness of up to approximately 200 microns. The surface features of the susceptor may be machined into the graphite. In one embodiment, the first protective layer is polished after deposition.

At block 615, the susceptor is heated to a temperature of above 200 degrees Celsius. For example, the susceptor may be heated to a temperature of 200-400 degrees Celsius. In one embodiment, the susceptor is heated to a temperature of 300 degrees Celsius.

At block 620, IAD is performed to deposit a second protective layer over one or more surfaces of the first protective layer while the susceptor is heated. In one embodiment, the second protective layer covers just a plasma facing surface of the first protective layer. In another embodiment, the second protective layer covers the first protective layer on a front and back of the susceptor. In another embodiment, the second protective layer covers every surface of the first protective layer. In one embodiment, oxygen and/or argon ions are directed to the susceptor by ion guns prior to the IAD deposition. The oxygen and argon ions may burn off any surface organic contamination on the first protective layer and disperse any remaining particles.

Two types of IAD that may be performed include EB-IAD and IBS-IAD. EB-IAD may be performed by evaporation. IBS-IAD may be performed by sputtering a solid target material. The second protective layer may be $Y_3Al_6O_{12}$, $Y_4Al_2O_9$, $Er_3Al_6O_{12}$, or $YF_3$. The second protective layer may be amorphous and may be resistant to cracking at temperatures of 450° C. In one embodiment, the protective layer may not experience any cracking even after repeated thermal cycling up to 550° C. In a further embodiment, the second protective layer is resistant to cracking at temperatures of room temperature up to 650° C. The second protective layer may be resistant to cracking though it is deposited over the first protective layer and the susceptor, both of which may have different coefficients of thermal expansion than the second protective layer.

A deposition rate for the second protective layer may be about 1-8 Angstroms per second, and may be varied by tuning deposition parameters. In one embodiment, the deposition rate is 1-2 Angstroms per second (A/s). The deposition rate may also be varied during deposition. In one embodiment, an initial deposition rate of about 0.25-1 A/s is used to achieve a conforming well adhering coating on the substrate. Subsequently, a deposition rate of 2-10 A/s is used to achieve a thicker coating in a shorter and more cost effective coating run.

The second protective layer may be a thin film protective layer that may be very conforming, be uniform in thickness, and have a good adhesion to the material that it is deposited on. In one embodiment, the second protective layer has a thickness of less than 1000 microns. In a further embodiment, the second protective layer has a thickness of 5-50 microns. In still a further embodiment, the second protective layer has a thickness of less than 20 microns.

At block 625, a determination is made regarding whether to deposit any additional protective layers (e.g., any additional thin film protective layers). If an additional protective layer is to be deposited, the process continues to block 630. At block 630, another protective layer is formed over the second protective layer using IAD.

In one embodiment, the other protective layer is composed of a ceramic that is different than a ceramic of the second protective layer. In one embodiment, the other protective layer is one of $Y_3Al_6O_{12}$, $Y_4Al_2O_9$, $Er_2O_3$, $Gd_2O_3$, $Er_3Al_6O_{12}$, $Gd_3Al_6O_{12}$, $YF_3$, or the ceramic compound of $Y_4Al_2O_9$ and a solid-solution of $Y_2O_3$—$ZrO_2$.

In another embodiment, the other protective layer is composed of a ceramic that is the same as a ceramic of the second protective layer. For example, a mask may be placed over the susceptor after formation of the second protective layer. This mask may have openings where features such as mesas and seals are to be formed on the susceptor (e.g., in depressions in the susceptor). The additional protective layer may then be deposited to form these features. In one embodiment, the features (e.g., mesas) have a height of 10-20 microns.

The method then returns to block 625. If at block 625 no additional thin film protective layers are to be applied, the process ends.

Figure 7A:
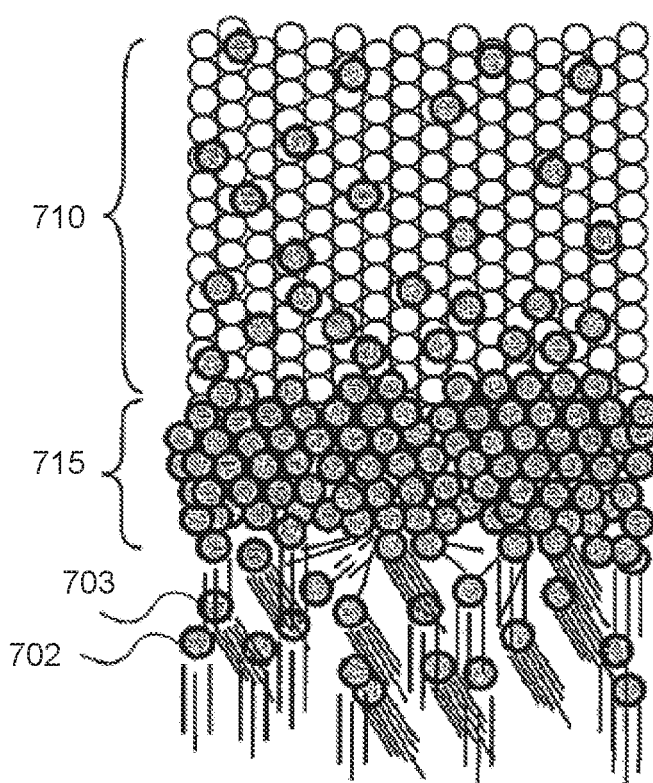
FIG. 7A depicts a deposition mechanism applicable to a variety of deposition techniques utilizing energetic particles such as ion assisted deposition (IAD).

FIG. 7A depicts a deposition mechanism applicable to a variety of deposition techniques utilizing energetic particles such as ion assisted deposition (IAD). Exemplary IAD methods include deposition processes which incorporate ion bombardment, such as evaporation (e.g., activated reactive evaporation (ARE) or EB-IAD) and sputtering (e.g., IBS-IAD) in the presence of ion bombardment to form plasma resistant coatings as described herein. Any of the IAD methods may be performed in the presence of a reactive gas species, such as $O_2$, $N_2$, halogens, etc.

As shown, the thin film protective layer 715 is formed by an accumulation of deposition materials 702 in the presence of energetic particles 703 such as ions. The deposition materials 702 include atoms, ions, radicals, or their mixture. The energetic particles 703 may impinge and compact the thin film protective layer 715 as it is formed.

Figure 7B:
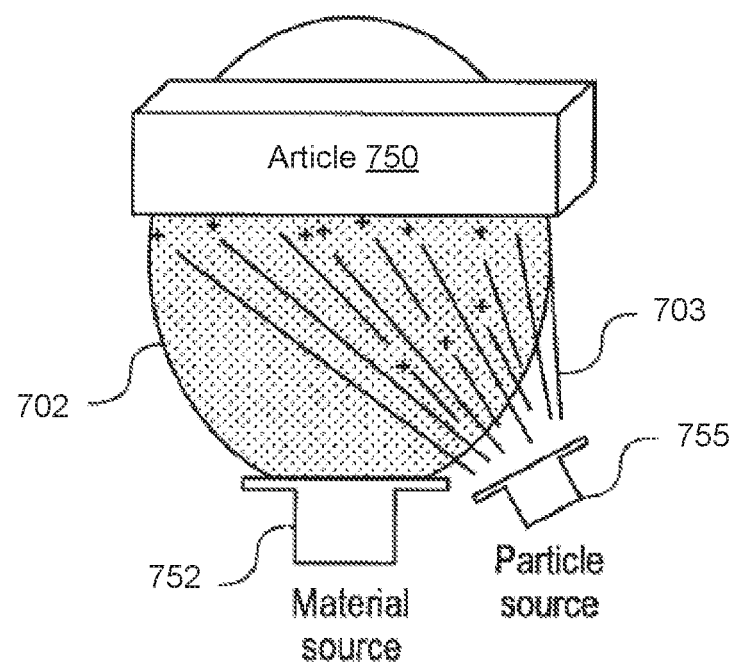
FIG. 7B depicts a schematic of an IAD deposition apparatus.

In one embodiment, IAD is utilized to form the thin film protective layer 715, as previously described elsewhere herein. FIG. 7B depicts a schematic of an IAD deposition apparatus. As shown, a material source 752 (also referred to as a target body) provides a flux of deposition materials 702 while an energetic particle source 755 provides a flux of the energetic particles 703, both of which impinge upon the article 750 throughout the IAD process. The energetic particle source 755 may be an Oxygen or other ion source. The energetic particle source 755 may also provide other types of energetic particles such as inert radicals, neutron atoms, and nano-sized particles which come from particle generation sources (e.g., from plasma, reactive gases or from the material source that provides the deposition materials). The material source (e.g., a target body) 752 used to provide the deposition materials 702 may be a bulk sintered ceramic corresponding to the same ceramic that the thin film protective layer 715 is to be composed of. For example, the material source may be a bulk sintered ceramic compound body, or bulk sintered YAG, $Er_2O_3$, $Gd_2O_3$, $Er_3Al_5O_{12}$, $YF_3$, or $Gd_3Al_5O_{12}$. IAD may utilize one or more plasmas or beams to provide the material and energetic ion sources. Alternatively, the material source may be a metal.

Reactive species may also be provided during deposition of the plasma resistant coating. In one embodiment, the energetic particles 703 include at least one of non-reactive species (e.g., Ar) or reactive species (e.g., O). In further embodiments, reactive species such as CO and halogens (Cl, F, Br, etc.) may also be introduced during the formation of a plasma resistant coating to further increase the tendency to selectively remove deposited material most weakly bonded to the thin film protective layer 715.

With IAD processes, the energetic particles 703 may be controlled by the energetic ion (or other particle) source 755 independently of other deposition parameters. The energy (e.g., velocity), density and incident angle of the energetic ion flux may be adjusted to control a composition, structure, crystalline orientation and grain size of the thin film protective layer. Additional parameters that may be adjusted are a temperature of the article during deposition as well as the duration of the deposition.

The ion assist energy is used to densify the coating and to accelerate the deposition of the material on the surface of the substrate. Ion assist energy can be varied using both the voltage and current of the ion source. The voltage and current can be adjusted to achieve high and low coating density, to manipulate a stress of the coating and also a crystallinity of the coating. The ion assist energy may range from approximately 50-500 V and approximately 1-50 amps (A). The ion assist energy can also be used to intentionally change a stoichiometry of the coating. For example, a metallic target can be used during deposition, and converted to a metal oxide.

Coating temperature can be controlled by using heaters to heat a deposition chamber and/or a substrate and by adjusting a deposition rate. Substrate (article) temperature during deposition may be roughly divided into low temperature (around 120-150° C. in one embodiment which is typical room temperature) and high temperature (around 270° C. or above in one embodiment). In one embodiment, a deposition temperature of around 300° C. is used. Alternatively, higher (e.g., up to 450 degrees ° C.) or lower (e.g., down to room temperature) deposition temperatures may be used. Deposition temperature can be used to adjust film stress, crystallinity, and other coating properties.

A working distance is a distance between the electron beam (or ion beam) gun and the substrate. The working distance can be varied to achieve a coating with a highest uniformity. Additionally, working distance may affect deposition rate and density of the coating.

A deposition angle is the angle between the electron beam (or ion beam) and the substrate. Deposition angle can be varied by changing the location and/or orientation of the substrate. By optimizing the deposition angle, a uniform coating in three dimensional geometries can be achieved.

EB-IAD and IBS-IAD depositions are feasible on a wide range of surface conditions. However, polished surfaces are preferred to achieve a uniform coating coverage. Various fixtures may be used to hold the substrate during the IAD deposition.

Figure 8:
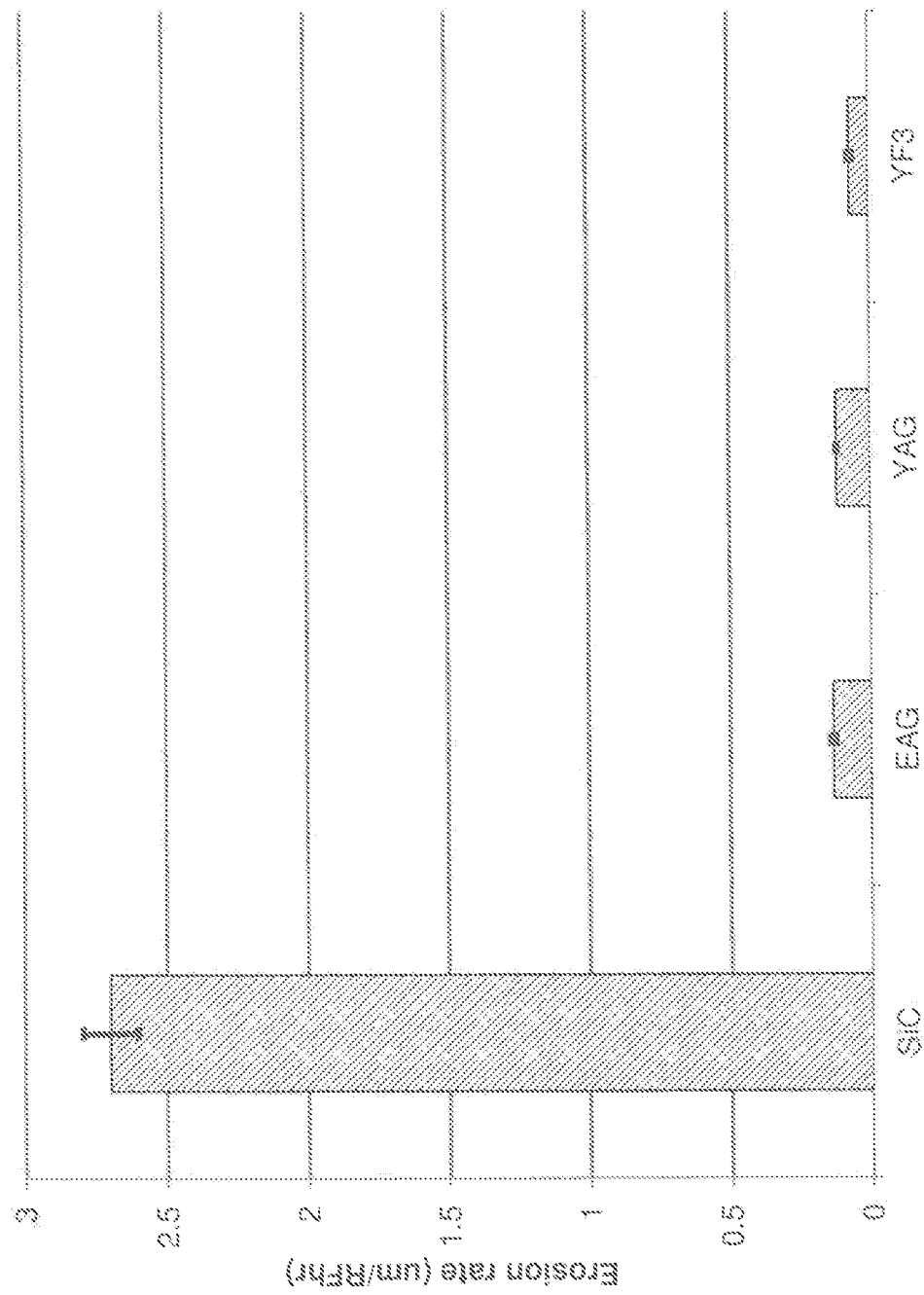
FIG. 8 illustrates erosion rates for thin film protective layers formed in accordance with embodiments of the present invention.

FIG. 8 illustrates erosion rates for thin film protective layers formed in accordance with embodiments of the present invention. FIG. 8 shows erosion rates of thin film protective layers when exposed to an $NF_3$ plasma chemistry. As shown, the IAD deposited thin film protective layers show a much improved erosion resistance as compared to SiC. For example, SiC showed an erosion rate of above 2.5 µm per radiofrequency hour (µm/RFHr). In contrast IAD deposited EAG, YAG and $YF_3$ thin film protective layers all showed an erosion rate of less than 0.2 µm/RFHr.

The preceding description sets forth numerous specific details such as examples of specific systems, components, methods, and so forth, in order to provide a good understanding of several embodiments of the present invention. It will be apparent to one skilled in the art, however, that at least some embodiments of the present invention may be practiced without these specific details. In other instances, well-known components or methods are not described in detail or are presented in simple block diagram format in order to avoid unnecessarily obscuring the present invention. Thus, the specific details set forth are merely exemplary. Particular implementations may vary from these exemplary details and still be contemplated to be within the scope of the present invention.

Reference throughout this specification to "one embodiment" or "an embodiment" means that a particular feature, structure, or characteristic described in connection with the embodiment is included in at least one embodiment. Thus, the appearances of the phrase "in one embodiment" or "in an embodiment" in various places throughout this specification are not necessarily all referring to the same embodiment. In addition, the term "or" is intended to mean an inclusive "or" rather than an exclusive "or." When the term "about" or "approximately" is used herein, this is intended to mean that the nominal value presented is precise within ±30%.

Although the operations of the methods herein are shown and described in a particular order, the order of the operations of each method may be altered so that certain operations may be performed in an inverse order or so that certain operation may be performed, at least in part, concurrently with other operations. In another embodiment, instructions or sub-operations of distinct operations may be in an intermittent and/or alternating manner.

It is to be understood that the above description is intended to be illustrative, and not restrictive. Many other embodiments will be apparent to those of skill in the art upon reading and understanding the above description. The scope of the invention should, therefore, be determined with reference to the appended claims, along with the full scope of equivalents to which such claims are entitled.

What is claimed is:

1. A plasma resistant article comprising:
    a body comprising a thermally conductive material, wherein the thermally conductive material is a thermally conductive semimetal or a thermally conductive glass-carbon;
    a first protective layer on a surface of the body, the first protective layer being a thermally conductive ceramic and having a thickness of about 5 µm to about 100 µm; and
    a second protective layer on the first protective layer, the second protective layer comprising a plasma resistant ceramic thin film having a thickness of about 5 µm to about 50 µm and a porosity of less than about 1%, the second protective layer being resistant to cracking at temperatures of up to 650 degrees Celsius, and the plasma resistant ceramic thin film comprising a rare earth-containing ceramic.

2. The plasma resistant article of claim 1, wherein the thermally conductive material comprises graphite.

3. The plasma resistant article of claim 1, wherein the thermally conductive material comprises the thermally conductive semimetal and the first protective layer comprises silicon carbide.

4. The plasma resistant article of claim 1, wherein the plasma resistant article is a susceptor for an atomic layer deposition chamber.

5. The plasma resistant article of claim 4, wherein the first protective layer comprises a plurality of depressions, each of the plurality of depressions being configured to support a wafer and having a plurality of surface features, wherein the second protective layer conforms to the plurality of depressions and to the plurality of surface features.

6. The plasma resistant article of claim 1, wherein:
the body comprises the thermally conductive semimetal and the thermally conductive semimetal is graphite;
the first protective layer comprises silicon carbide; and
the second protective layer is a conformal layer that has a porosity of less than 1%; and
the rare earth-containing ceramic is selected from the group consisting of $Er_3Al_5O_{12}$, $Y_3Al_5O_{12}$ and $YF_3$.

7. The plasma resistant article of claim 1, further comprising:
a protective layer stack on the first protective layer, the protective layer stack comprising at least the second protective layer and a third protective layer covering the second protective layer, wherein the third protective layer has a thickness of less than 20 microns and comprises at least one of $Y_3Al_5O_{12}$, $Y_4Al_2O_9$, $Er_2O_3$, $Gd_2O_3$, $Er_3Al_5O_{12}$, $Gd_3Al_5O_{12}$, or a ceramic compound comprising $Y_4Al_2O_9$ and a solid-solution of $Y_2O_3$—$ZrO_2$.

8. The plasma resistant article of claim 1, wherein the second protective layer is erosion resistant to plasmas having a fluorine based chemistry.

9. The plasma resistant article of claim 1, further comprising:
a plurality of plasma resistant plugs in a plurality of holes in the body, wherein the second protective layer covers the plurality of plasma resistant plugs.

10. The plasma resistant article of claim 9, wherein the plurality of plasma resistant plugs are composed of a sintered ceramic comprising at least one of AlN, $Y_2O_3$ or a ceramic compound comprising $Y_4Al_2O_9$ and a solid-solution of $Y_2O_3$—$ZrO_2$.

11. A method of forming a plasma resistant article, comprising:
providing an article comprising a thermally conductive body, wherein the thermally conductive body comprises a thermally conductive semimetal or a thermally conductive glass-carbon;
depositing a first protective layer on a surface of the thermally conductive body to a thickness of about 5μm to about 100 μm, the first protective layer comprising a thermally conductive ceramic; and
performing ion assisted deposition to deposit a second protective layer over the first protective layer to a thickness of about 5 μm to about 50 μm and a porosity of less than about 1%, the second protective layer comprising a plasma resistant ceramic thin film that is resistant to cracking at temperatures of up to 650 degrees Celsius, and the plasma resistant ceramic thin film comprising a rare earth-containing ceramic.

12. The method of claim 11, further comprising:
heating the article to a temperature of 200-400 degrees Celsius; and
performing the ion assisted deposition while the article is heated.

13. The method of claim 11, wherein depositing the first protective layer comprises performing a chemical vapor deposition process.

14. The method of claim 11, wherein:
the thermally conductive body comprises the thermally conductive semimetal and the thermally conductive semimetal is graphite;
the first protective layer comprises silicon carbide; and
the second protective layer is a conformal layer; and
the rare earth-containing ceramic is selected from the group consisting of $Er_3Al_5O_{12}$, $Y_3Al_5O_{12}$ and $YF_3$.

15. The method of claim 11, further comprising:
inserting a plurality of plasma resistant plugs into a plurality of holes in the thermally conductive body before depositing the first protective layer or before performing the ion assisted deposition, wherein the plurality of plasma resistant plugs are composed of a sintered ceramic comprising at least one of AlN, $Y_2O_3$ or a ceramic compound comprising $Y_4Al_2O_9$ and a solid-solution of $Y_2O_3$—$ZrO_2$.

* * * * *